United States Patent
Satoskar et al.

(10) Patent No.: US 9,880,802 B2
(45) Date of Patent: Jan. 30, 2018

(54) SYSTEMS AND METHODS FOR REDUCING AUDIO ARTIFACTS FROM SWITCHING BETWEEN PATHS OF A MULTI-PATH SIGNAL PROCESSING SYSTEM

(71) Applicant: Cirrus Logic International Semiconductor Ltd., Edinburgh (GB)

(72) Inventors: Aniruddha Satoskar, Austin, TX (US); Daniel J. Allen, Austin, TX (US); Edmund Mark Schneider, Austin, TX (US); Tejasvi Das, Austin, TX (US); Ku He, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 73 days.

(21) Appl. No.: 15/003,371

(22) Filed: Jan. 21, 2016

(65) Prior Publication Data
US 2017/0212721 A1 Jul. 27, 2017

(51) Int. Cl.
*G06F 3/00* (2006.01)
*G06F 3/16* (2006.01)
(Continued)

(52) U.S. Cl.
CPC ............ *G06F 3/165* (2013.01); *G10L 25/09* (2013.01); *H03M 1/12* (2013.01)

(58) Field of Classification Search
CPC ........... G06F 3/165; H03M 1/12; G10L 25/09
See application file for complete search history.

(56) References Cited

U.S. PATENT DOCUMENTS 4,346,349 A 8/1982 Yokoyama
4,446,440 A 5/1984 Bell
(Continued)

FOREIGN PATENT DOCUMENTS

EP 0351788 A2 7/1989
EP 0966105 A2 12/1999
(Continued)

OTHER PUBLICATIONS

International Search Report and Written Opinion of the International Searching Authority, International Application No. PCT/US2016/040096, dated Mar. 24, 2017.
(Continued)

*Primary Examiner* — Muhammad N Edun
(74) *Attorney, Agent, or Firm* — Jackson Walker L.L.P.

(57) ABSTRACT

A processing path may include a controller and a plurality of processing paths including a first processing path and a second processing path. The first path may be configured to generate a first digital signal based on an analog input signal and the second path may be configured to generate a second digital signal based on the analog input signal, wherein the first path has a lower gain and a higher noise floor than the second path. The controller may be configured to determine that a transition between the first path and the second path needs to occur based on the analog input signal crossing a threshold or a prediction that the input signal will cross the threshold and in response to determining the transition between the first path and the second path needs to occur, blend the transition during or near zero cross points of the analog input signal.

22 Claims, 6 Drawing Sheets

(51) Int. Cl.
    *G10L 25/09*    (2013.01)
    *H03M 1/12*    (2006.01)

(56)            References Cited

U.S. PATENT DOCUMENTS

| | | | |
|---|---|---|---|
| 4,493,091 | A | 1/1985 | Gundry |
| 4,890,107 | A | 12/1989 | Pearce |
| 4,972,436 | A | 11/1990 | Halim et al. |
| 4,999,628 | A | 3/1991 | Kakaubo et al. |
| 4,999,830 | A | 3/1991 | Agazzi |
| 5,077,539 | A | 12/1991 | Howatt |
| 5,148,167 | A | 9/1992 | Ribner |
| 5,198,814 | A | 3/1993 | Ogawara et al. |
| 5,272,449 | A | 12/1993 | Izawa |
| 5,321,758 | A | 6/1994 | Charpentier et al. |
| 5,323,159 | A | 6/1994 | Imamura et al. |
| 5,343,161 | A | 8/1994 | Tokumo et al. |
| 5,550,923 | A | 8/1996 | Hotvet |
| 5,600,317 | A | 2/1997 | Knoth et al. |
| 5,714,956 | A | 2/1998 | Jahne et al. |
| 5,719,641 | A | 2/1998 | Mizoguchi |
| 2,810,477 | A | 9/1998 | Abraham et al. |
| 5,808,575 | A | 9/1998 | Himeno et al. |
| 6,088,461 | A | 7/2000 | Lin |
| 6,160,455 | A | 12/2000 | French et al. |
| 6,201,490 | B1 | 3/2001 | Kawano et al. |
| 6,271,780 | B1 | 8/2001 | Gong et al. |
| 6,333,707 | B1 | 12/2001 | Oberhammer et al. |
| 6,353,404 | B1 | 3/2002 | Kuroiwa |
| 6,542,612 | B1 | 4/2003 | Needham |
| 6,614,297 | B2 | 9/2003 | Score et al. |
| 6,683,494 | B2 | 1/2004 | Stanley |
| 6,745,355 | B1 | 6/2004 | Tamura |
| 6,768,443 | B2 | 7/2004 | Willis |
| 6,822,595 | B1 | 11/2004 | Robinson |
| 6,853,242 | B2 | 2/2005 | Melanson et al. |
| 6,888,888 | B1 | 5/2005 | Tu et al. |
| 6,897,794 | B2 | 5/2005 | Kuyel et al. |
| 6,989,955 | B2 | 1/2006 | Ziemer et al. |
| 7,020,892 | B2 | 3/2006 | Levesque et al. |
| 7,023,268 | B1 | 4/2006 | Taylor et al. |
| 7,061,312 | B2 | 6/2006 | Andersen et al. |
| 7,167,112 | B2 | 1/2007 | Andersen et al. |
| 7,216,249 | B2 | 5/2007 | Fujiwara et al. |
| 7,279,964 | B2 | 10/2007 | Bolz et al. |
| 7,302,354 | B2 | 11/2007 | Zhuge |
| 7,312,734 | B2 | 12/2007 | McNeill et al. |
| 7,315,204 | B2 | 1/2008 | Seven |
| 7,365,664 | B2 | 4/2008 | Caduff et al. |
| 7,378,902 | B2 | 5/2008 | Sorrells et al. |
| 7,385,443 | B1 | 6/2008 | Denison |
| 7,403,010 | B1 | 7/2008 | Hertz |
| 7,440,891 | B1 | 10/2008 | Shozakai et al. |
| 7,522,677 | B2 | 4/2009 | Liang |
| 7,583,215 | B2 | 9/2009 | Yamamoto et al. |
| 7,671,768 | B2 | 3/2010 | De Ceuninck |
| 7,679,538 | B2 | 3/2010 | Tsang |
| 7,737,776 | B1 | 6/2010 | Cyrusian |
| 7,893,856 | B2 | 2/2011 | Ek et al. |
| 7,924,189 | B2 | 4/2011 | Sayers |
| 7,937,106 | B2 | 5/2011 | Sorrells et al. |
| 8,060,663 | B2 | 11/2011 | Murray et al. |
| 8,130,126 | B2 | 3/2012 | Breitschaedel et al. |
| 8,298,425 | B2 | 10/2012 | Kanbe |
| 8,330,631 | B2 | 12/2012 | Kumar et al. |
| 8,362,936 | B2 | 1/2013 | Ledzius et al. |
| 8,462,035 | B2 | 6/2013 | Schimper et al. |
| 8,483,753 | B2 | 7/2013 | Behzad et al. |
| 8,508,397 | B2 | 8/2013 | Hisch |
| 8,717,211 | B2 | 5/2014 | Miao et al. |
| 8,786,477 | B1 | 7/2014 | Albinet |
| 8,836,551 | B2 | 9/2014 | Nozaki |
| 8,873,182 | B2 | 10/2014 | Liao et al. |
| 8,878,708 | B1 | 11/2014 | Sanders et al. |
| 8,952,837 | B2 | 2/2015 | Kim et al. |
| 9,071,201 | B2 | 6/2015 | Jones et al. |
| 9,071,267 | B1 | 6/2015 | Schneider et al. |
| 9,071,268 | B1 | 6/2015 | Schneider et al. |
| 9,118,401 | B1 | 8/2015 | Nieto et al. |
| 9,148,164 | B1 | 9/2015 | Schneider et al. |
| 9,171,552 | B1 | 10/2015 | Yang |
| 9,178,462 | B2 | 11/2015 | Kurosawa et al. |
| 9,210,506 | B1 | 12/2015 | Nawfal et al. |
| 9,306,588 | B2 | 4/2016 | Das et al. |
| 9,337,795 | B2 | 5/2016 | Das et al. |
| 9,391,576 | B1 * | 7/2016 | Satoskar ............... H03M 1/186 |
| 9,503,027 | B2 | 11/2016 | Zanbaghi |
| 9,525,940 | B1 | 12/2016 | Schneider et al. |
| 9,543,975 | B1 | 1/2017 | Melanson et al. |
| 9,584,911 | B2 | 2/2017 | Das et al. |
| 9,596,537 | B2 | 3/2017 | He et al. |
| 9,635,310 | B2 | 4/2017 | Chang et al. |
| 9,762,255 | B1 | 9/2017 | Satoskar et al. |
| 9,774,342 | B1 | 9/2017 | Schneider et al. |
| 9,807,504 | B2 | 10/2017 | Melanson et al. |
| 9,813,814 | B1 | 11/2017 | Satoskar |
| 2001/0001547 | A1 | 5/2001 | Delano et al. |
| 2001/0009565 | A1 | 7/2001 | Singvall |
| 2004/0078200 | A1 | 4/2004 | Alves |
| 2004/0184621 | A1 | 9/2004 | Andersen et al. |
| 2005/0068097 | A1 | 3/2005 | Kim et al. |
| 2005/0084037 | A1 | 4/2005 | Liang |
| 2005/0258989 | A1 | 11/2005 | Li et al. |
| 2005/0276359 | A1 | 12/2005 | Xiong |
| 2006/0056491 | A1 | 3/2006 | Lim et al. |
| 2006/0064037 | A1 | 3/2006 | Shalon et al. |
| 2006/0098827 | A1 | 5/2006 | Paddock et al. |
| 2006/0284675 | A1 | 12/2006 | Krochmal et al. |
| 2007/0018719 | A1 | 1/2007 | Seven |
| 2007/0026837 | A1 * | 2/2007 | Bagchi .................. H04B 1/30 |
| | | | 455/333 |
| 2007/0057720 | A1 | 3/2007 | Hand et al. |
| 2007/0092089 | A1 | 4/2007 | Seefeldt et al. |
| 2007/0103355 | A1 | 5/2007 | Yamada |
| 2007/0120721 | A1 | 5/2007 | Caduff et al. |
| 2007/0123184 | A1 | 5/2007 | Nesimoglu et al. |
| 2007/0146069 | A1 | 6/2007 | Wu et al. |
| 2008/0030577 | A1 | 2/2008 | Cleary et al. |
| 2008/0114239 | A1 | 5/2008 | Randall et al. |
| 2008/0143436 | A1 | 6/2008 | Xu |
| 2008/0159444 | A1 | 7/2008 | Terada |
| 2008/0198048 | A1 | 8/2008 | Klein et al. |
| 2008/0292107 | A1 | 11/2008 | Bizjak |
| 2009/0015327 | A1 | 1/2009 | Wu et al. |
| 2009/0021643 | A1 | 1/2009 | Hsueh et al. |
| 2009/0051423 | A1 | 2/2009 | Miaille et al. |
| 2009/0058531 | A1 | 3/2009 | Hwang et al. |
| 2009/0084586 | A1 | 4/2009 | Nielsen |
| 2009/0220110 | A1 | 9/2009 | Bazarjani et al. |
| 2010/0168882 | A1 | 7/2010 | Zhang et al. |
| 2010/0183163 | A1 | 7/2010 | Matsui et al. |
| 2011/0013733 | A1 | 1/2011 | Martens et al. |
| 2011/0025540 | A1 | 2/2011 | Katsis |
| 2011/0029109 | A1 | 2/2011 | Thomsen et al. |
| 2011/0063148 | A1 | 3/2011 | Kolze et al. |
| 2011/0096370 | A1 | 4/2011 | Okamoto |
| 2011/0136455 | A1 | 6/2011 | Sundstrom et al. |
| 2011/0150240 | A1 | 6/2011 | Akiyama et al. |
| 2011/0170709 | A1 | 7/2011 | Guthrie et al. |
| 2011/0188671 | A1 | 8/2011 | Anderson et al. |
| 2011/0228952 | A1 | 9/2011 | Lin |
| 2011/0242614 | A1 | 10/2011 | Okada |
| 2011/0268301 | A1 | 11/2011 | Nielsen et al. |
| 2011/0285463 | A1 | 11/2011 | Walker et al. |
| 2012/0001786 | A1 | 1/2012 | Hisch |
| 2012/0047535 | A1 | 2/2012 | Bennett et al. |
| 2012/0133411 | A1 | 5/2012 | Miao et al. |
| 2012/0177201 | A1 | 7/2012 | Ayling et al. |
| 2012/0177226 | A1 | 7/2012 | Silverstein et al. |
| 2012/0188111 | A1 | 7/2012 | Ledzius et al. |
| 2012/0207315 | A1 | 8/2012 | Kimura et al. |
| 2012/0242521 | A1 | 9/2012 | Kinyua |
| 2012/0250893 | A1 | 10/2012 | Carroll et al. |
| 2012/0263090 | A1 | 10/2012 | Porat et al. |

(56) References Cited

U.S. PATENT DOCUMENTS

| | | |
|---|---|---|
| 2012/0274490 A1 | 11/2012 | Kidambi et al. |
| 2012/0280726 A1 | 11/2012 | Colombo et al. |
| 2013/0095870 A1 | 4/2013 | Phillips et al. |
| 2013/0106635 A1 | 5/2013 | Doi |
| 2013/0129117 A1 | 5/2013 | Thomsen et al. |
| 2013/0188808 A1 | 7/2013 | Pereira et al. |
| 2013/0241753 A1 | 9/2013 | Nozaki |
| 2013/0241755 A1 | 9/2013 | Chen et al. |
| 2014/0044280 A1 | 2/2014 | Jiang |
| 2014/0105256 A1 | 4/2014 | Hanevich et al. |
| 2014/0105273 A1 | 4/2014 | Chen et al. |
| 2014/0126747 A1 | 5/2014 | Huang |
| 2014/0135077 A1 | 5/2014 | Leviant et al. |
| 2014/0184332 A1 | 7/2014 | Shi et al. |
| 2014/0269118 A1 | 9/2014 | Taylor et al. |
| 2014/0368364 A1 | 12/2014 | Hsu |
| 2015/0170663 A1 | 6/2015 | Disch et al. |
| 2015/0214974 A1 | 7/2015 | Currivan |
| 2015/0214975 A1 | 7/2015 | Gomez et al. |
| 2015/0249466 A1 | 9/2015 | Elyada |
| 2015/0295584 A1 | 10/2015 | Das et al. |
| 2015/0327174 A1 | 11/2015 | Rajagopal et al. |
| 2015/0381130 A1 | 12/2015 | Das et al. |
| 2016/0072465 A1 | 3/2016 | Das et al. |
| 2016/0080862 A1 | 3/2016 | He et al. |
| 2016/0080865 A1 | 3/2016 | He et al. |
| 2016/0173112 A1 | 6/2016 | Das et al. |
| 2016/0181988 A1 | 6/2016 | Du et al. |
| 2016/0286310 A1 | 9/2016 | Das et al. |
| 2016/0365081 A1 | 12/2016 | Satoskar et al. |
| 2017/0047895 A1 | 2/2017 | Zanbaghi |
| 2017/0150257 A1 | 5/2017 | Das et al. |

FOREIGN PATENT DOCUMENTS

| | | |
|---|---|---|
| EP | 1244218 A1 | 9/2002 |
| EP | 1575164 A2 | 9/2005 |
| EP | 1753130 A1 | 2/2007 |
| EP | 1798852 A2 | 6/2009 |
| EP | 2207264 A1 | 7/2010 |
| GB | 1599401 A | 9/1981 |
| GB | 2119189 A | 11/1983 |
| GB | 2307121 A | 6/1997 |
| GB | 2507096 A | 4/2014 |
| GB | 2527637 A | 12/2015 |
| GB | 2527677 B | 10/2016 |
| GB | 2537694 A | 10/2016 |
| GB | 2537697 A | 10/2016 |
| GB | 2539517 A | 12/2016 |
| JP | 2008294803 A | 12/2008 |
| WO | WO0054403 A1 | 9/2000 |
| WO | 02/37686 A2 | 5/2002 |
| WO | 2006018750 A1 | 2/2006 |
| WO | 2008067260 A1 | 6/2008 |
| WO | 2014113471 A1 | 7/2014 |
| WO | 2015160655 | 10/2015 |
| WO | 2016040165 A1 | 3/2016 |
| WO | 2016040171 A1 | 3/2016 |
| WO | 2016040177 A1 | 3/2016 |
| WO | 2016160336 A1 | 10/2016 |
| WO | 2016202636 A1 | 12/2016 |

OTHER PUBLICATIONS

International Search Report and Written Opinion of the International Searching Authority, International Application No. PCT/US2017/014240, dated Apr. 24, 2017.
Groeneweg, B.P., et al., A Class-AB/D Audio Power Amplifier for Mobile Applications Integrated Into a 2.5G/3G Baseband Processo1016r, IEEE Transactions on Circuits and Systems—I: Regular Papers, vol. 57, No. 5, May 2010, pp. 1003-1016.
Chen, K., et al., A High-PSRR Reconfigurable Class-AB/D Audio. Amplifier Driving a Hands-Free/Receiver. 2-in-1 Loudspeaker, IEEE Journal of Solid-State Circuits, vol. 47, No. 11, Nov. 2012, pp. 2586-2603.
Combined Search and Examination Report, GB Application No. GB1602288.1, dated Aug. 9, 2016, 6 pages.
Combined Search and Examination Report, GB Application No. GB1603628.7, dated Aug. 24, 2016, 6 pages.
International Search Report and Written Opinion, International Application No. PCT/EP2016/062862, dated Aug. 26, 2016, 14 pages.
International Search Report and Written Opinion, International Application No. PCT/US2015/056357, dated Jan. 29, 2015, 13 pages.
Combined Search and Examination Report, GB Application No. GB1514512.1, dated Feb. 11, 2016, 7 pages.
International Search Report and Written Opinion, International Application No. PCT/US2015/048609, dated Mar. 23, 2016, 23 pages.
International Search Report and Written Opinion, International Application No. PCT/US2016/022578, dated Jun. 22, 2016, 12 pages.
Combined Search and Examination Report, GB Application No. GB1600528.2, dated Jul. 7, 2016, 8 pages.
Thaden, Rainer et al., A Loudspeaker Management System with FIR/IRR Filtering; AES 32nd International Conference, Hillerod, Denmark, Sep. 21-23, 2007; pp. 1-12.
Thaden, Rainer et al., A Loudspeaker Management System with FIR/IRR Filtering; Slides from a presentation given at the 32nd AES conference "DSP for Loudspeakers" in Hillerod, Denmark in Sep. 2007; http://www.four-audio.com/data/AES32/AES32FourAudio.pdf; 23 pages.
GB Patent Application No. 1419651.3, Improved Analogue-to-Digital Convertor, filed Nov. 4, 2014, 65 pages.
Combined Search and Examination Report, GB Application No. GB1506258.1, dated Oct. 21, 2015, 6 pages.
International Search Report and Written Opinion, International Patent Application No. PCT/US2015/025329, dated Aug. 11, 2015, 9 pages.
International Search Report and Written Opinion, International Patent Application No. PCT/US2015/048633, dated Dec. 10, 2015, 11 pages.
International Search Report and Written Opinion, International Patent Application No. PCT/US2015/048591, dated Dec. 10, 2015, 11 pages.
Combined Search and Examination Report, GB Application No. GB1510578.6, dated Aug. 3, 2015, 3 pages.
International Search Report and Written Opinion of the International Searching Authority, International Application No. PCT/US2016/065134, dated Mar. 15, 2017.
Combined Search and Examination Report under Sections 17 and 18(3) of the UKIPO, Application No. GB1620427.3, dated Jun. 1, 2017.
Combined Search and Examination Report under Sections 17 and 18(3) of the UKIPO, Application No. GB1620428.1, dated Jul. 21, 2017.
Combined Search and Examination Report under Sections 17 and 18(3) of the UKIPO, Application No. GB1700371.6, dated Aug. 1, 2017.
Combined Search and Examination Report under Sections 17 and 18(3), United Kingdom Intellectual Property Office, Application No. GB1702540.4, dated Oct. 2, 2017.
Combined Search and Examination Report under Sections 17 and 18(3), United Kingdom Intellectual Property Office, Application No. GB1702655.0, dated Oct. 24, 2017.
Combined Search and Examination Report under Sections 17 and 18(3), United Kingdom Intellectual Property Office, Application No. GB1706693.7, dated Oct. 26, 2017.
Combined Search and Examination Report under Sections 17 and 18(3), United Kingdom Intellectual Property Office, Application No. GB1706690.3, dated Oct. 30, 2017.
Search Report under Section 17, United Kingdom Intellectual Property Office, Application No. GB1702656.8, dated Oct. 31, 2017.

(56) References Cited

OTHER PUBLICATIONS

International Search Report and Written Opinion of the International Searching Authority, International Patent Application No. PCT/US2017/045861, dated Nov. 14, 2017.
International Search Report and Written Opinion of the International Searching Authority, International Patent Application No. PCT/US2017/046083, dated Nov. 14, 2017.
Combined Search and Examination Report under Sections 17 and 18(3), United Kingdom Intellectual Property Office, Application No. GB1708546.5, dated Nov. 22, 2017.

* cited by examiner

SYSTEMS AND METHODS FOR REDUCING AUDIO ARTIFACTS FROM SWITCHING BETWEEN PATHS OF A MULTI-PATH SIGNAL PROCESSING SYSTEM

FIELD OF DISCLOSURE

The present disclosure relates in general to signal processing systems, and more particularly, to multiple path signal processing systems.

BACKGROUND

The use of multipath analog-to-digital converters (ADCs) and analog front ends (AFEs) (e.g., two or more path ADCs/AFEs) in electrical circuits is known. Example multipath ADCs and AFEs and use of them in multiple electrical circuit paths are disclosed in U.S. Pat. No. 5,714,956 entitled "Process and System for the Analog-to-Digital Conversion of Signals" to Jahne et al. ("Jahne patent") and U.S. Pat. No. 5,600,317 entitled "Apparatus for the Conversion of Analog Audio Signals to a Digital Data Stream" to Knoth et al. ("Knoth patent") and U.S. Pat. No. 6,271,780 entitled "Gain Ranging Analog-to-Digital Converter with Error Correction" to Gong et al. ("Gong patent"). The use of multipath circuits may reduce noise as one path may be optimized for processing small amplitude signals (e.g., for processing low noise signals) while another circuit path with another set of ADC and AFE is optimized for large amplitude signals (e.g., allowing for higher dynamic range).

An example application for multipath ADCs/AFEs is use of it in a circuit for an audio system application, such as an audio mixing board or in a digital microphone system. Such an example application is disclosed in the Jahne patent. In designing a circuit with multipath ADCs/AFEs that are used in respective multiple circuit paths, a tradeoff may exist between allowing larger signal swing (e.g., to allow swing of a signal between larger scale amplitudes) and low noise. Furthermore, the multipath ADCs/AFEs may provide high dynamic range signal digitization, with higher dynamic range for a given input power, and lower overall area than would be possible with conventional means. In other words, by allowing a separate optimization for each type of signal (e.g., large and small signals) that is provided each respective path, multipath ADCs/AFEs allows the overall circuit to burn less power, consume less area, and save on other such design costs.

Despite their advantages, existing multipath ADC/AFE approaches have disadvantages and problems. For example, many existing approaches have disadvantages related to transitioning and switching between the multiple paths, as such switching may not be smooth, leading to undesirable signal artifacts, especially in audio applications in which such artifacts may be perceptible to a listener of an audio device. As another example, a trend in electric circuits is to scale circuitry to the integrated circuit level. However, existing approaches to multipath AFEs/ADCs do not scale well to the integrated circuit level.

SUMMARY

In accordance with the teachings of the present disclosure, certain disadvantages and problems associated with implementation of multiple AFE/ADC paths may be reduced or eliminated.

In accordance with embodiments of the present disclosure, a processing path may include a controller and a plurality of processing paths including a first processing path and a second processing path. The first processing path may be configured to generate a first digital signal based on an analog input signal and the second processing path may be configured to generate a second digital signal based on the analog input signal, wherein the first processing path has a lower gain and a higher noise floor than the second processing path. The controller may be configured to determine that a transition between the first processing path and the second processing path needs to occur based on the analog input signal crossing a threshold or a prediction that the input signal will cross the threshold and in response to determining the transition between the first processing path and the second processing path needs to occur, blend the transition during or near zero cross points of the analog input signal.

In accordance with these and other embodiments of the present disclosure, a method may include generating a first digital signal with a first processing path based on an analog input signal, generating a second digital signal with a second processing path based on the analog input signal, wherein the first processing path has a lower gain and a higher noise floor than the second processing path, determining that a transition between the first processing path and the second processing path needs to occur based on the analog input signal crossing a threshold or a prediction that the input signal will cross the threshold, and, in response to determining the transition between the first processing path and the second processing path needs to occur, blending the transition during or near zero cross points of the analog input signal.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
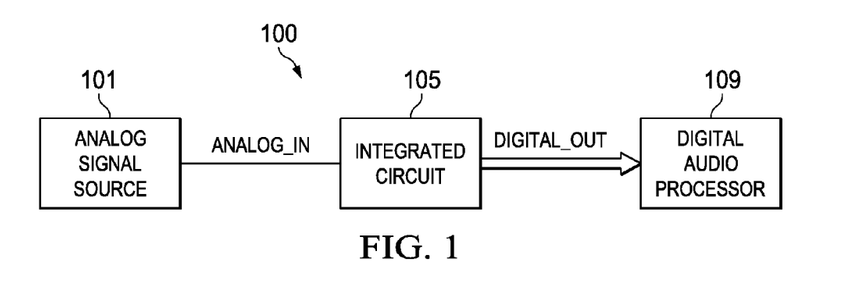
FIG. 1 illustrates a block diagram of selected components of an example signal processing system, in accordance with embodiments of the present disclosure.

FIG. 1 illustrates a block diagram of selected components of an example signal processing system 100, in accordance with embodiments of the present disclosure. As shown in FIG. 1, signal processing system 100 may include an analog signal source 101, an integrated circuit (IC) 105, and a digital processor 109. Analog signal source 101 may comprise any system, device, or apparatus configured to generate an analog electrical signal, for example an analog input signal ANALOG_IN. For example, in embodiments in which signal processing system 100 is a processing system, analog signal source 101 may comprise a microphone transducer.

Integrated circuit 105 may comprise any suitable system, device, or apparatus configured to process analog input signal ANALOG_IN to generate a digital output signal DIGITAL_OUT and condition digital output signal DIGITAL_OUT for transmission over a bus to digital processor 109. Once converted to digital output signal DIGITAL_OUT, the signal may be transmitted over significantly longer distances without being susceptible to noise as compared to an analog transmission over the same distance. In some embodiments, integrated circuit 105 may be disposed in close proximity with analog signal source 101 to ensure that the length of the analog line between analog signal source 101 and integrated circuit 105 is relatively short to minimize the amount of noise that can be picked up on an analog output line carrying analog input signal ANALOG_IN. For example, in some embodiments, analog signal source 101 and integrated circuit 105 may be formed on the same substrate. In other embodiments, analog signal source 101 and integrated circuit 105 may be formed on different substrates packaged within the same integrated circuit package.

Digital processor 109 may comprise any suitable system, device, or apparatus configured to process a digital output signal for use in a digital system. For example, digital processor 109 may comprise a microprocessor, microcontroller, digital signal processor (DSP), application specific integrated circuit (ASIC), or any other device configured to interpret and/or execute program instructions and/or process data, such as digital output signal DIGITAL_OUT.

Signal processing system 100 may be used in any application in which it is desired to process an analog signal to generate a digital signal. Thus, in some embodiments, signal processing system 100 may be integral to an audio device that converts analog signals (e.g., from a microphone) to digital signals representing the sound incident on a microphone. As another example, signal processing system 100 may be integral to a radio-frequency device (e.g., a mobile telephone) to convert radio-frequency analog signals into digital signals.

Figure 2:
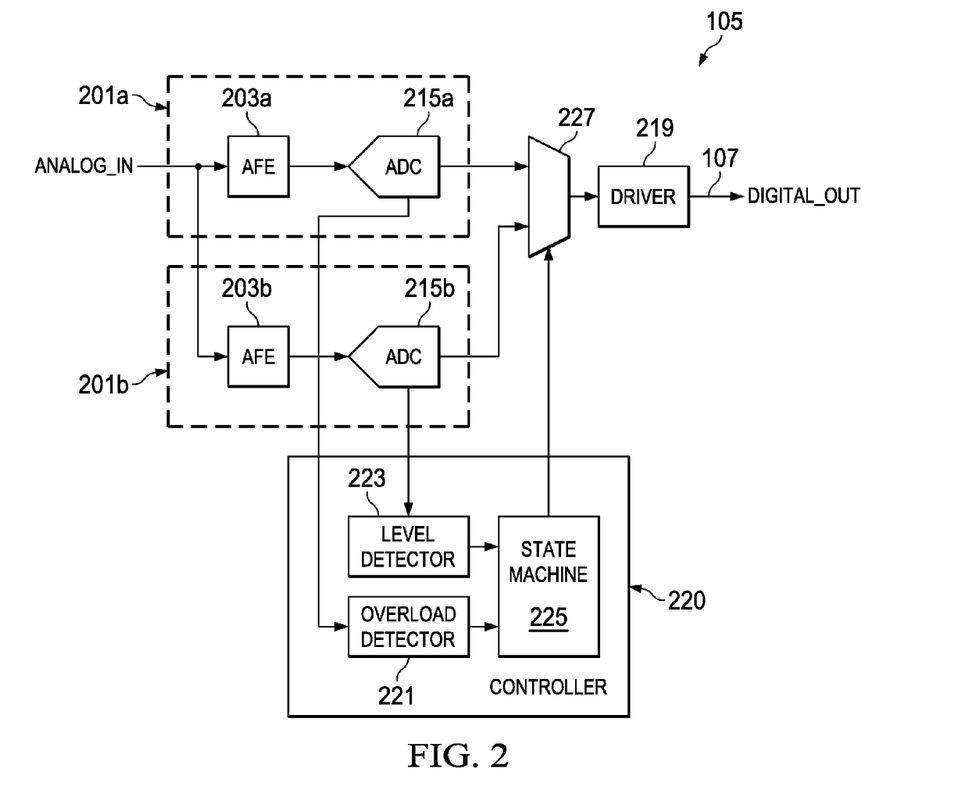
FIG. 2 illustrates a block diagram of selected components of an integrated circuit for processing an analog signal to generate a digital signal, in accordance with embodiments of the present disclosure.

FIG. 2 illustrates a block diagram of selected components of integrated circuit 105, in accordance with embodiments of the present disclosure. As shown in FIG. 2, integrated circuit 105 may include two or more processing paths 201a and 201b (which may be referred to herein individually as a processing path 201 and collectively as processing paths 201), each processing path 201 including a respective AFE 203 (e.g., AFE 203a, AFE 203b) and a respective ADC (e.g., ADC 215a, ADC 215b). An AFE 203 may receive analog input signal ANALOG_IN via one or more input lines which may allow for receipt of a single-ended signal, differential signal, or any other suitable analog signal format and may comprise any suitable system, device, or apparatus configured to condition analog input signal ANALOG_IN for processing by ADC 215. Selected components for example embodiments of AFEs 203a and 203b are discussed in greater detail below with respect to FIG. 3. The output of each AFE 203 may be communicated to a respective ADC 215 on one or more output lines.

An ADC 215 may comprise any suitable system, device, or apparatus configured to convert an analog signal received at its input, to a digital signal representative of analog input signal ANALOG_IN. ADC 215 may itself include one or more components (e.g., delta-sigma modulator, decimator, etc.) for carrying out the functionality of ADC 215. Selected components for the example embodiments of ADCs 215a and 215b are discussed in greater detail below with respect to FIG. 3.

A multiplexer 227 may receive a respective digital signal from each of processing paths 201 and may select one of the digital signals as digital output signal DIGITAL_OUT based on a control signal generated by and communicated from a controller 220.

Driver 219 may receive the digital signal DIGITAL_OUT output by ADC 215 and may comprise any suitable system, device, or apparatus configured to condition such digital signal (e.g., encoding into Audio Engineering Society/European Broadcasting Union (AES/EBU), Sony/Philips Digital Interface Format (S/PDIF)), in the process, generating digital output signal DIGITAL_OUT for transmission over a bus to digital processor 109. In FIG. 2, the bus receiving digital output signal DIGITAL_OUT is shown as single-ended. In some embodiments, driver 219 may generate a differential digital output signal 107.

Controller 220 may comprise any suitable system, device, or apparatus for selecting one of the digital signals output by the various processing paths 201 as digital output signal DIGITAL_OUT. In some embodiments, controller 220 may make such selection based on a magnitude of analog input signal ANALOG_IN or a signal derivative thereof. For example, controller 220 may include an overload detector 221 that may determine whether or not a signal derivative of analog input signal ANALOG_IN (e.g., an output of a modulator 316a of delta-sigma modulator 308a, as shown in greater detail in FIG. 3) is likely to cause clipping or other distortion of digital output signal DIGITAL_OUT if a particular processing path (e.g., processing path 201a) is selected. If clipping or other distortion of digital output signal DIGITAL_OUT is likely if the particular processing path (e.g., processing path 201a) is selected, state machine 225 of controller 220 may generate a control signal so that another processing path (e.g., processing path 201b) is selected. To further illustrate, in some embodiments, processing path 201a may be a path adapted for low amplitudes of analog input signal ANALOG_IN and may thus have a high signal gain and low noise floor, while processing path 201b may be a path adapted for higher amplitudes of analog input signal ANALOG_IN and may thus have a lower signal gain and higher noise floor. Thus, if analog input signal ANALOG_IN or a derivative thereof is greater than a threshold value indicative of a condition whereby digital output signal DIGITAL_OUT may experience clipping or other distortion if processing path 201a is selected, overload detector 221 may detect such condition, and cause state machine 225 to generate a control signal to select the digital signal generated by processing path 201b as digital output signal DIGITAL_OUT.

As another example, controller 220 may include a level detector 223 that may detect an amplitude of analog input signal ANALOG_IN or a signal derivative thereof (e.g., a signal generated within ADC 215b) and communicate a signal indicative of such amplitude to state machine 225. Responsive to the signal received from level detector 223, state machine 225 may generate the control signal communicated to multiplexer 227. To illustrate, as analog input signal ANALOG_IN decreases from a relatively high amplitude to a lower amplitude, it may cross a threshold amplitude level whereby controller 220 may change the selection of digital output signal DIGITAL_OUT from the digital signal generated by processing path 201b (which may be adapted for higher amplitudes of analog input signal ANALOG_IN) to the digital signal generated by processing path 201a (which may be adapted for lower amplitudes of analog input signal ANALOG_IN). In some embodiments, a threshold amplitude level whereby controller 220 may change the selection of digital output signal DIGITAL_OUT from the digital signal generated by processing path 201b to the digital signal generated by processing path 201a may be lower than another threshold amplitude level whereby controller 220 may change the selection of digital output signal DIGITAL_OUT from the digital signal generated by processing path 201a to the digital signal generated by processing path 201b, in order to provide for hysteresis so that multiplexer 227 does not repeatedly switch between the paths.

Figure 3:
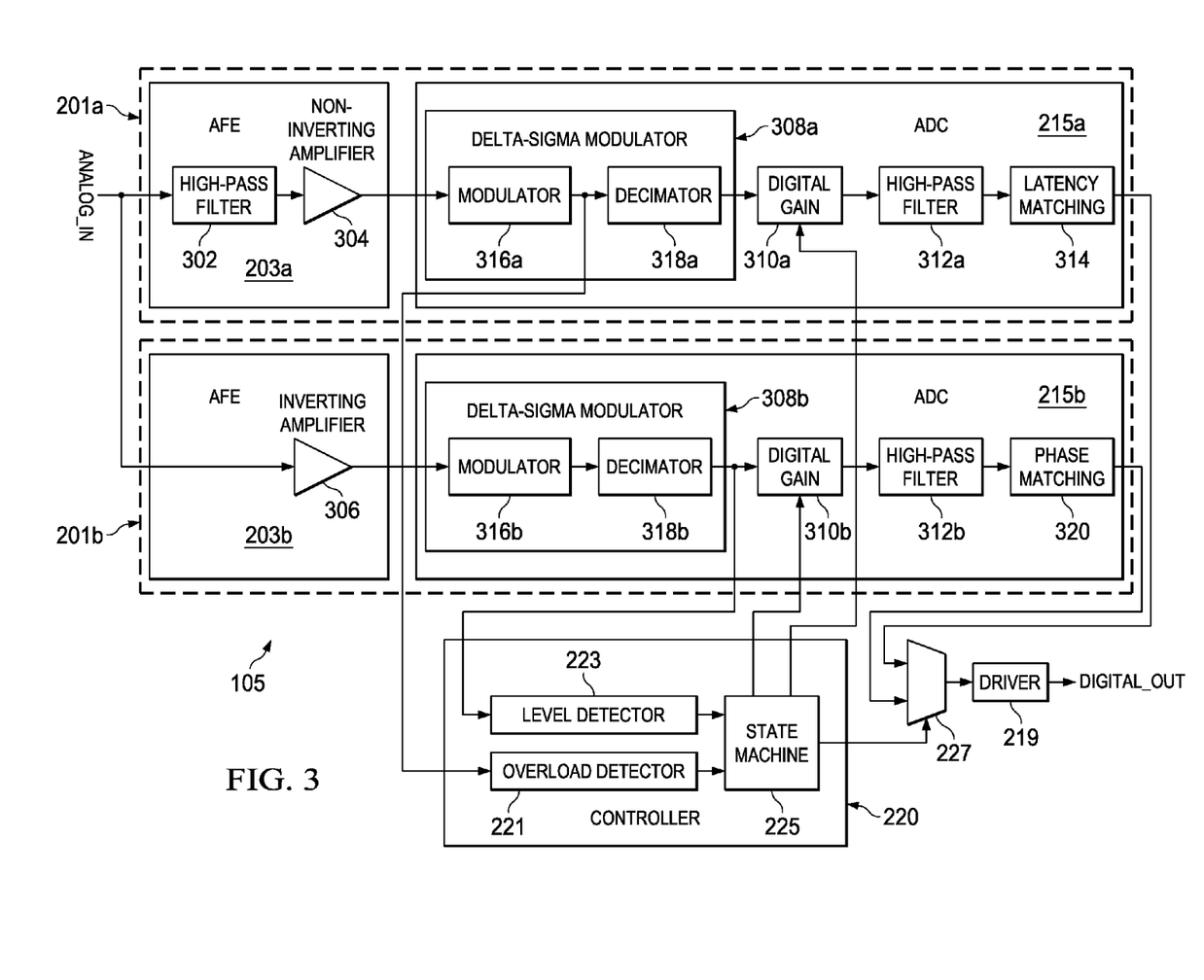
FIG. 3 illustrates a block diagram of selected components of the integrated circuit of FIG. 2 depicting selected components of example embodiments of analog front ends and analog-to-digital converters, in accordance with embodiments of the present disclosure.

FIG. 3 illustrates a block diagram of selected components of integrated circuit 105 depicting selected components of example embodiments of AFEs 203 and ADCs 215, in accordance with embodiments of the present disclosure. As shown in FIG. 3, analog front end 203a of processing path 201a may include a high-pass filter 302 configured to high-pass filter analog input signal ANALOG_IN to remove direct current offsets or biases, which are often particularly troublesome for high-gain amplifiers, and output such filtered signal to a non-inverting amplifier 304. Non-inverting amplifier 304 may amplify analog input signal ANALOG_IN by a non-inverting gain and communicate such amplified analog signal to ADC 215a. In some embodiments, high-pass filter 302 may be formed on the same integrated circuit as one or more of AFE 203a, AFE 203b, ADC 215a, and ADC 215b. Because of the presence of high-pass filter 302 in processing path 201a, but not processing path 201b, processing paths 201 may each have a different frequency response to analog input signal ANALOG_IN.

Also as shown in FIG. 3, analog front end 203b of processing path 201b may include an inverting amplifier 306 which may amplify analog input signal ANALOG_IN by an inverting gain and communicate such amplified analog signal to ADC 215b. In some embodiments, inverting amplifier 306 may be configured to apply a multiplicative gain of less than unity to analog input signal ANALOG_IN. By attenuating higher-amplitude signals, a greater dynamic range for analog input signal ANALOG_IN may be achieved, in spite of conventional wisdom that would generally dictate that signal loss should be avoided in a low-noise system. In these and other embodiments, although not depicted in FIG. 3, inverting amplifier 306 may receive the output of high-pass filter 302 instead of the unfiltered analog input signal ANALOG_IN.

Although AFEs 203a and 203b are described above having a non-inverting gain and an inverting gain, respectively, each of processing paths 201 may have approximately the same cumulative gain. Those of skill in the art may appreciate that simply applying a digital gain with a negative sign in either of ADC 215a or ADC 215b will negate the opposite polarities of the gains of AFEs 203.

As depicted in FIG. 3, each ADC 215 may include a respective delta-sigma modulator 308 (e.g., delta-sigma modulators 308a and 308b), a respective digital gain element 310 (e.g., digital gain elements 310a and 310b), and respective high-pass filters 312 (e.g., high-pass filters 312a and 312b). Each delta-sigma modulator 308 may be configured to modulate an analog signal into a corresponding digital signal. As known in the art, each delta-sigma modulator 308 may include a respective modulator 316 (e.g., modulators 316a, 316b) and a decimator 318 (e.g., decimators 318a, 318b). Each digital gain element 310 may apply a gain to a digital signal generated by its associated delta-sigma modulator 308. Each high-pass filter 312 may high-pass filter a digital signal generated by its associated digital gain element 310, to filter out any direct-current offsets present in the digital signal. High-pass filter 312b may also compensate for high-pass filter 302 present in AFE 203a.

In addition, ADC 215a may comprise a latency matching element 314 to match any signal latencies between processing path 201a and processing path 201b, while ADC 215b may comprise a phase matching element 320 to account for any phase offset between processing path 201a and processing path 201b. For example, phase matching element 320 may dynamically compensate for any phase mismatch between processing paths 201a and 201b by varying a delay of at least one of processing path 201a and processing path 201b. In some embodiments, phase matching element 320 may comprise a high-pass filter.

In some embodiments, a magnitude of a gain of non-inverting amplifier 304 may be substantially larger than (e.g., significantly more than manufacturing tolerances, one or more orders of magnitude) a magnitude of a gain of inverting amplifier 306. In addition, in these and other embodiments, a magnitude of digital gain element 310b may be substantially larger than (e.g., significantly more than manufacturing tolerances, one or more orders of magnitude) a magnitude of a gain of digital gain element 310a. Consequently, in such embodiments, a first path gain equal to the product of the magnitude of the gain of inverting amplifier 306 and the magnitude of a gain of digital gain element 310b may be substantially equal (e.g., within manufacturing tolerances) to a second path gain equal to the product of the magnitude of gain of non-inverting amplifier 304 and the gain of digital gain element 310a. As a specific example, in some embodiments, the inverting gain of inverting amplifier 306 may be approximately −6 decibels, the non-inverting gain of non-inverting amplifier 304 may be approximately 20 decibels, the gain of digital gain element 310a may be approximately −26 decibels, and the gain of digital gain element 310b may be approximately 0 decibels.

Accordingly, each processing path 201 may be adapted to process a particular amplitude of analog input signal ANALOG_IN. For example, AFE 203a may be suited to process lower signal amplitudes, as non-inverting amplifier 304 may have a practically infinite input resistance, may have a relatively low level of input-referred noise as compared to inverting amplifier 306, and its larger gain may permit effective processing of smaller signals, but characteristics of AFE 203a may not be amenable to higher amplitudes. The high input resistance of non-inverting amplifier 304 may facilitate the use of a smaller capacitor area for high-pass filter 302 (as compared to traditional approaches for implementing high-pass filters) and thus may permit integration of circuitry of high-pass filter 302 into the same integrated circuit as non-inverting amplifier 304, inverting amplifier 306, ADC 215a, and/or ADC 215b. In addition, the ability to integrate circuitry into a single integrated circuit may allow for centralized control of the stimuli for switching between processing paths 201 by controller 220, and may allow for more direct timing control of the actual switching and transitioning between processing paths 201. For example, because circuitry is integrated into a single integrated circuitry, level detector 223 may receive an output of delta-sigma modulator 308b as an input signal, rather than receiving an output of ADC 215b.

On the other hand, AFE 203b may be suited to process higher signal amplitudes, as its lower gain will reduce the likelihood of signal clipping, and may provide for greater dynamic range for analog input signal ANALOG_IN as compared to traditional approaches.

Despite a designer's best efforts to match the first path gain and the second path gain, process variations, temperature variations, manufacturing tolerances, and/or other variations may lead to the first path gain and the second path gain being unequal. If switching between paths occurs when such path gains are unequal, signal artifacts may occur due to an instantaneous, discontinuous change in magnitude of the digital output signal between two gain levels. For example, in audio signals, such artifacts may include human-perceptible "pops" or "clicks" in acoustic sounds generated from audio signals. In some embodiments, in order to reduce or eliminate the occurrence of such artifacts when switching selection between the digital output signal of ADC 215a and the digital output signal of ADC 215b, and vice versa, controller 220 may program an additional gain into one or both of processing paths 201 to compensate for differences in the first path gain and second path gain. This additional gain factor may equalize the first path gain and the second path gain To illustrate, controller 220 may determine a scale factor indicative of the magnitude of difference (e.g., whether an intentional difference or unintentional mismatch) between the first path gain of processing path 201a and the second path gain of processing path 201b. The controller may determine the first path gain and the second path gain by comparing the digital output signals of each processing path to analog input signal ANALOG_IN or a derivative thereof. If such digital output signals have been filtered by a high-pass filter (e.g., high-pass filters 312), a direct-current offset between the signals may be effectively filtered out, which may be necessary to accurately compute the relative path gains. Controller 220 may determine the scale factor by calculating one of a root mean square average of the first path gain and the second path gain and a least mean squares estimate of the difference between the first path gain and the second path gain. Prior to switching selection between the first digital signal generated by ADC 215a and the second digital signal generated by ADC 215b (or vice versa), controller 220 may program an additional gain into one of processing paths 201 to compensate for the gain difference indicated by the scale factor. For example, controller 220 may calibrate one or both of the first path gain and the second path gain by applying a gain equal to the scale factor or the reciprocal of the gain factor (e.g., 1/gain factor), as appropriate. Such scaling may be performed by modifying one or both of digital gains 310. In some embodiments, controller 220 may apply the additional gain to the processing path 201 of the digital signal not selected as digital output signal DIGITAL_OUT. For example, controller 220 may apply the additional gain to processing path 201a when the digital signal of ADC 215b is selected as digital output signal DIGITAL_OUT and apply the additional gain to processing path 201b when the digital signal of ADC 215a is selected as digital output signal DIGITAL_OUT.

In some embodiments, the additional gain, once applied to a path gain of a processing path 201, may be allowed over a period of time to approach or "leak" to a factor of 1, in order to constrain the additional gain and compensate for any cumulative (e.g., over multiple switching events between digital signals of ADCs 215) bias in the calculation of the additional gain. Without undertaking this step to allow the additional gain to leak to unity, multiple switching events between paths may cause the gain factor to increase or decrease in an unconstrained manner as such additional gain, if different than unity, affects the outputs of the multiple paths and thus affects the calculation of the scaling factor.

In these and other embodiments, in order to reduce or eliminate the occurrence of audio artifacts when switching selection between the digital output signal of ADC 215a and the digital output signal of ADC 215b, and vice versa, state machine 225 may wait until the occurrence of a zero crossing of analog input signal ANALOG_IN or a derivative thereof (e.g., as may be detected by level detector 223), at which point it may cause switching selection between the digital output signal of ADC 215a and the digital output signal of ADC 215b, or vice versa, by communicating an appropriate control signal to multiplexer 227. Although the foregoing contemplates switching at a zero crossing, in some embodiments, such switching may occur at a low magnitude of analog input signal ANALOG_IN or a derivative thereof (e.g., −70 decibels relative to full-scale magnitude). By changing the selectable digital gain and the selectable audio gain at a zero crossing or near-zero value of analog input signal ANALOG_IN (or a derivative thereof), the change and any auditory artifacts associated with the change may be masked and therefore be unnoticeable or less noticeable to a listener of an audio device including integrated circuit 105.

However, when transitioning switching selection between the digital output signal of ADC 215a and the digital output signal of ADC 215b, it may not be desirable to wait for a zero cross of the output signal, as a quick transition may be needed to avoid clipping of the audio signal. Accordingly, it may be desirable to predict whether the magnitude of analog input signal ANALOG_IN is likely to cross such predetermined threshold and switch the selectable digital gain and the selectable analog gain responsive to such prediction at a zero crossing event of analog input signal ANALOG_IN occurring before crossing of the predetermined threshold by analog input signal ANALOG_IN. By applying such predictive techniques, examples of which are explained below and illustrated by FIGS. 4-7, controller 220 may facilitate switching between processing paths 201 while reducing audio artifacts. FIGS. 4 through 9 illustrate example waveforms demonstrating predictive methodologies that may be performed by controller 220. In each of FIGS. 4 through 9, the y-axis represents a voltage of analog input signal ANALOG_IN given in decibels relative to a full-scale voltage of analog input signal ANALOG_IN.

Figure 4:
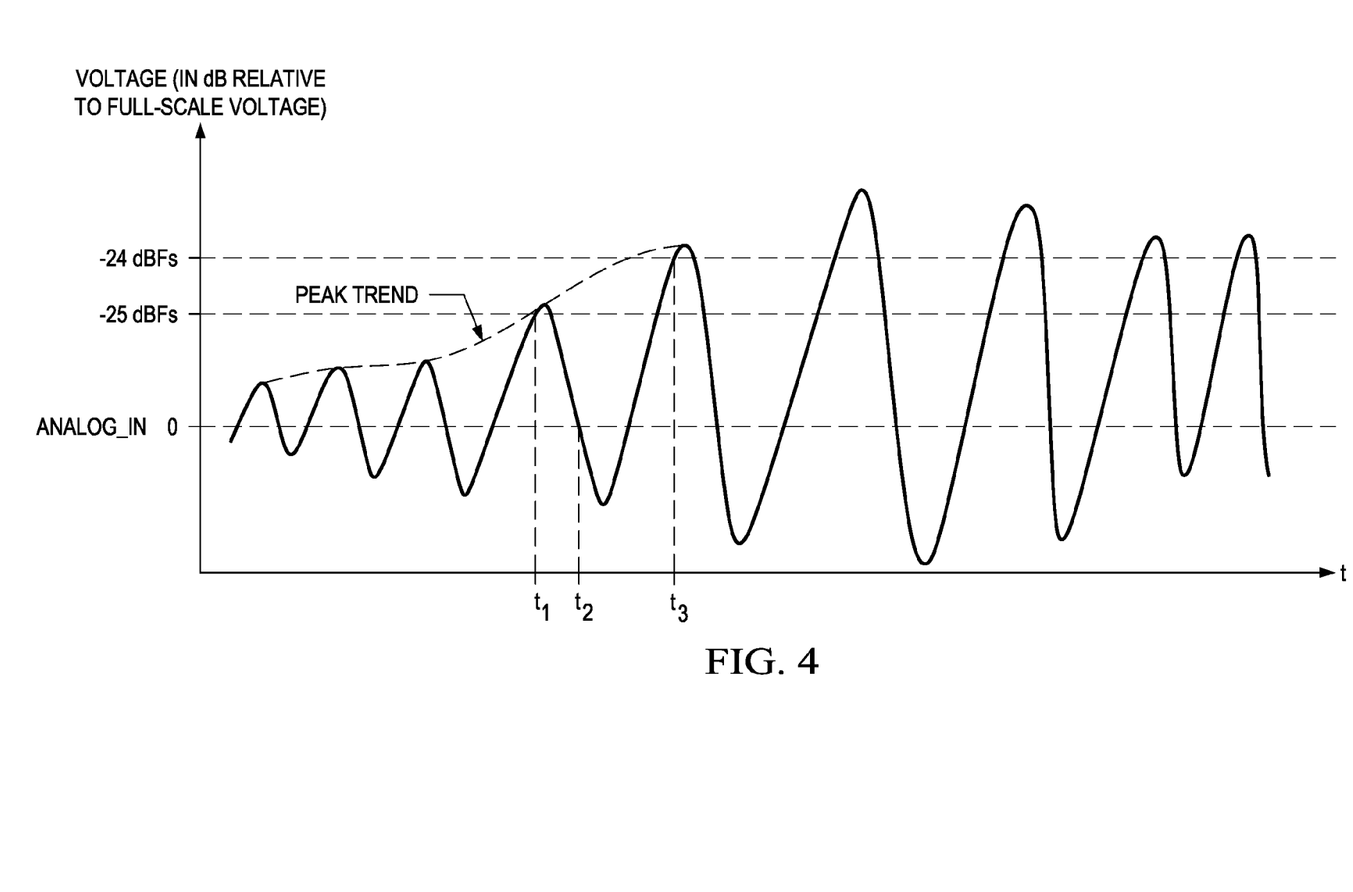
FIGS. 4 through 9 illustrate example waveforms demonstrating predictive methodologies performed by the controller circuit depicted in FIG. 3.

As depicted in the example waveform graph for analog input signal ANALOG_IN versus time shown in FIG. 4, controller 220 may predict whether the magnitude of analog input signal ANALOG_IN is likely to cross a predetermined primary threshold by determining whether analog input signal ANALOG_IN (or a derivative thereof) crosses a secondary threshold. To illustrate, to predict whether analog input signal ANALOG_IN will increase above a primary threshold for switching between processing paths 201 (e.g., −24 dB relative to full-scale voltage of analog input signal ANALOG_IN), controller 220 may monitor (e.g., with level detector 223) whether analog input signal ANALOG_IN increases above a secondary threshold (e.g., −25 dB relative to full-scale voltage of analog input signal ANALOG_IN) lower than the primary threshold, which occurs at time $t_1$ shown in FIG. 4. Responsive to analog input signal ANALOG_IN increasing above such secondary threshold, controller 220 may wait for the next zero-crossing event of analog input signal ANALOG_IN (e.g., as detected by level detector 223) which occurs at time $t_2$ shown in FIG. 4. At such zero-cross event, controller 220 may switch between selection of the digital signal generated by processing path 201a and the digital signal generated by processing path 201b. When analog input signal ANALOG_IN subsequently increases above the primary threshold (e.g., above −24 dB), which occurs at time $t_3$ shown in FIG. 4, no changes in selection between processing paths 201a and 201b may occur, as such change would have already occurred at the previous zero-crossing event.

In these and other embodiments, controller 220 may employ signal tracking techniques to predict whether analog input signal ANALOG_IN may increase above a secondary threshold. For example, controller 220 (e.g., via level detector 223) may track a peak trend of the magnitude peaks of analog input signal ANALOG_IN as shown in FIG. 4. From tracking the magnitude peaks, controller 220 may extrapolate the trend to determine if the magnitude of analog input signal ANALOG_IN is trending towards increasing above a primary threshold (e.g., −24 dB relative to full-scale voltage of digital audio input signal DIG_IN). Additionally or alternatively tracking peak trends, controller 220 (e.g., via level detector 223) may similarly track a signal envelope of analog input signal ANALOG_IN to determine whether analog input signal ANALOG_IN is trending towards increasing above a primary threshold.

Although FIG. 4 and the foregoing description thereof has depicted use of predictive approaches for determining whether analog input signal ANALOG_IN is likely to increase from below to above a primary threshold, similar approaches (e.g., secondary thresholds, peak tracking, signal envelope tracking, etc.) may also be used to determine whether analog input signal ANALOG_IN is likely to decrease from above to below a primary threshold and switch between selection of the digital signal generated by processing path 201b and the digital signal generated by processing path 201a in response to such predictions.

Figure 5:
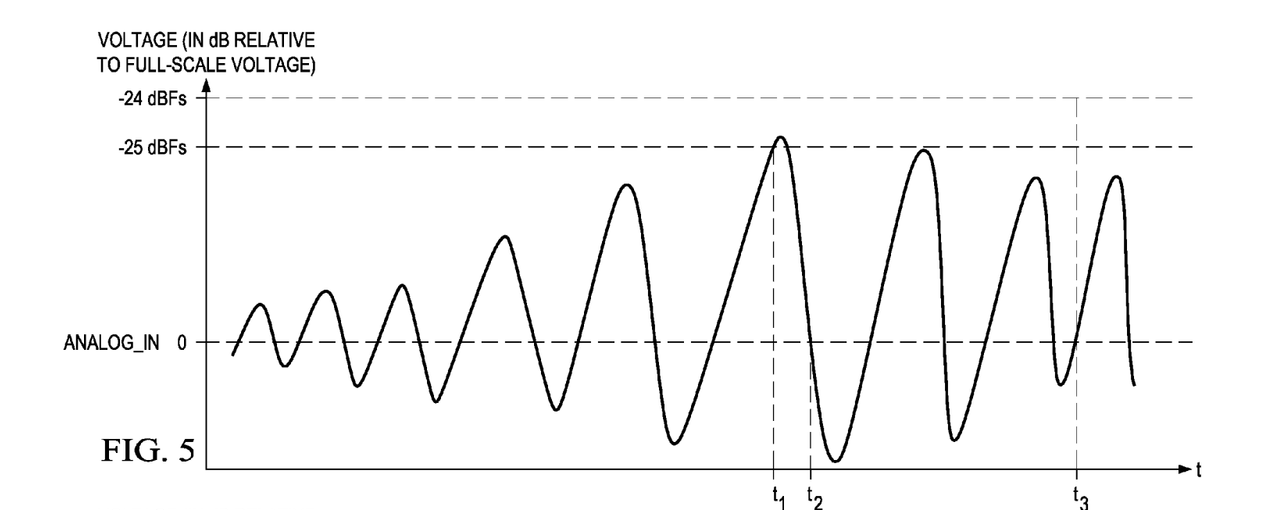

In some embodiments, state machine 225 may also implement a timing element (e.g., a timer or counter) in connection with a secondary threshold to determine whether analog input signal ANALOG_IN will increase above a primary threshold, as shown in FIG. 5. To illustrate, to predict whether analog input signal ANALOG_IN will increase above a primary threshold (e.g., −25 dB relative to full-scale voltage of analog input signal ANALOG_IN) for switching between selection of the digital signal generated by processing path 201a and the digital signal generated by processing path 201b, controller 220 may monitor (e.g., with level detector 223) whether analog input signal ANALOG_IN increases above a secondary threshold (e.g., −24 dB relative to full-scale voltage of analog input signal ANALOG_IN) lower than the primary threshold, which occurs at time $t_1$ shown in FIG. 5. Responsive to analog input signal ANALOG_IN increasing above such secondary threshold, controller 220 may wait for the next zero-crossing event of analog input signal ANALOG_IN which occurs at time $t_2$ shown in FIG. 4. At such zero-cross event, controller 220 may switch between selection of the digital signal generated by processing path 201a and the digital signal generated by processing path 201b. In addition, responsive to analog input signal ANALOG_IN increasing above such secondary threshold at time $t_1$, state machine 225 may initiate a timing element to time a duration beginning at the time $t_1$ in which the analog input signal ANALOG_IN increases above such secondary threshold. If, prior to a predetermined duration of time expiring, analog input signal ANALOG_IN increases above the primary threshold, controller 220 may maintain selection of the digital signal generated by processing path 201b at the zero-crossing event at time $t_2$. Otherwise, if the duration of time expires, shown as time $t_3$ in FIG. 3, prior to analog input signal ANALOG_IN increasing above the primary threshold, controller 220 may predict that an increase above the primary threshold may not occur, and may switch between selection of the digital signal generated by processing path 201b and the digital signal generated by processing path 201a.

Figure 6:
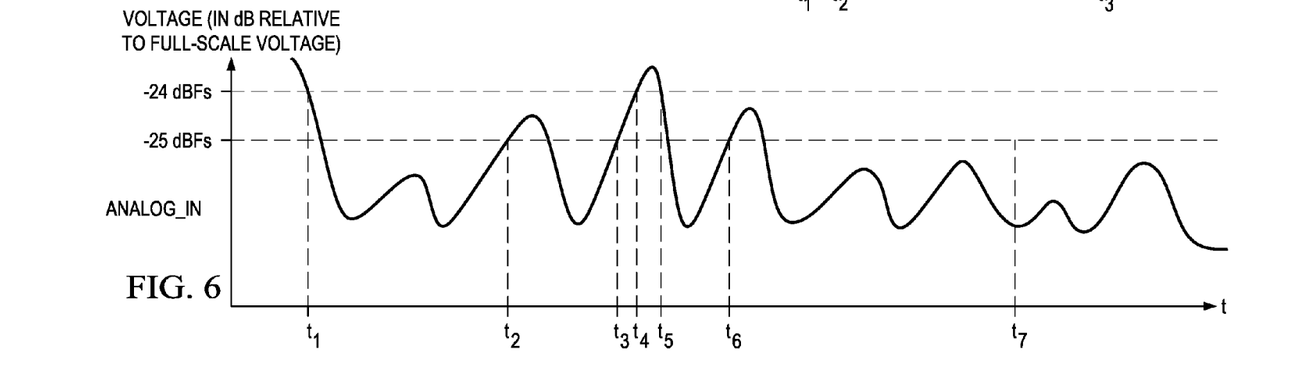

In addition or alternatively to the embodiments discussed above, controller 220 may employ a secondary threshold and a timing element to predict whether magnitude of analog input signal ANALOG_IN is to decrease below a predetermined primary threshold and remain below such primary threshold, as illustrated in FIG. 6. In the embodiments represented by FIG. 6, state machine 225 may initiate a timing element for a predetermined duration whenever the magnitude of analog input signal ANALOG_IN decreases from above to below a primary threshold (e.g., −24 dB relative to full-scale voltage of digital audio input signal DIG_IN) shown as times $t_1$ and $t_4$ in FIG. 6. If prior to the duration of time expiring, analog input signal ANALOG_IN increases above a secondary threshold (e.g., −25 dB relative to full-scale voltage of digital audio input signal DIG_IN) lesser than the primary threshold shown as times $t_2$, $t_3$, and $t_6$ in FIG. 6, the timing element may reset the predetermined duration of time. Upon expiration of the duration of time, shown as occurring at time $t_7$ in FIG. 6, thus indicating that analog input signal ANALOG_IN has not increased above the secondary threshold for longer than the duration of time, and provided that analog input signal ANALOG_IN is below the primary threshold, controller 220 may thus predict that analog input signal ANALOG_IN is and will remain below the primary threshold, and accordingly switch between selection of the digital signal generated by processing path 201b and the digital signal generated by processing path 201a. By using this predictive methodology, controller 220 may avoid switching events if the magnitude of analog input signal ANALOG_IN falls below the primary threshold but then in a short amount of time rises above the primary threshold again for a brief period of time. For example, in the graph depicted in FIG. 6, this predictive methodology prevents gain switching events from occurring at times $t_4$ and $t_5$.

Figure 7:
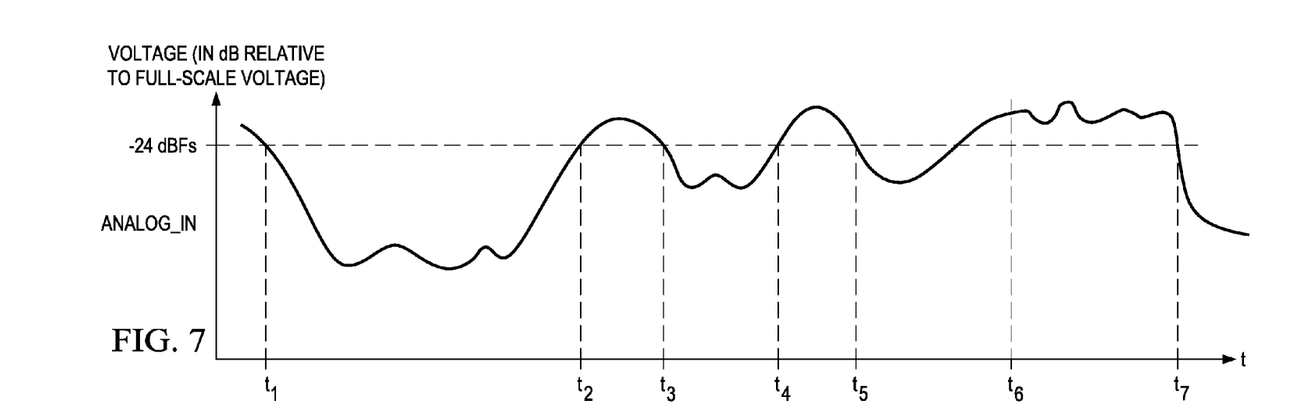

In addition or alternatively to the embodiments discussed above, controller 220 may employ one or more timing elements to disable switching between processing paths 201 when the magnitude of analog input signal ANALOG_IN hovers near a primary threshold, as illustrated in FIG. 7. In the embodiments represented by FIG. 7, upon the magnitude of analog input signal ANALOG_IN crossing a primary threshold (e.g., −24 dB relative to full-scale voltage of analog input signal ANALOG_IN), shown as times $t_1$, $t_2$, $t_3$, $t_4$, $t_5$, $t_6$, and $t_7$ in FIG. 7, state machine 225 may initiate a timing element for a predetermined duration. If prior to the predetermined duration of time expiring, analog input signal ANALOG_IN again crosses the primary threshold (e.g., the difference between times $t_2$ and each of times $t_3$, $t_4$, and/or $t_5$ may be less than the predetermined duration of time), controller 220 may disable switching between selection of the digital signal generated by processing path 201a and the digital signal generated by processing path 201b or vice versa (e.g., switching would not occur at times $t_3$, $t_4$, and $t_5$). Upon expiration of the predetermined duration of time, shown as occurring at time $t_6$ in FIG. 7, thus indicating that analog input signal ANALOG_IN has not crossed the primary threshold for longer than the predetermined duration of time, controller 220 may thus predict that analog input signal ANALOG_IN will not cross the primary threshold for a period of time and may re-enable switching between processing paths 201 when analog input signal ANALOG_IN again crosses the primary threshold, shown as time $t_7$ in FIG. 7. By using this predictive methodology, controller 220 may avoid multiple switching events if the magnitude of analog input signal ANALOG_IN hovers near the primary threshold.

Figure 8:
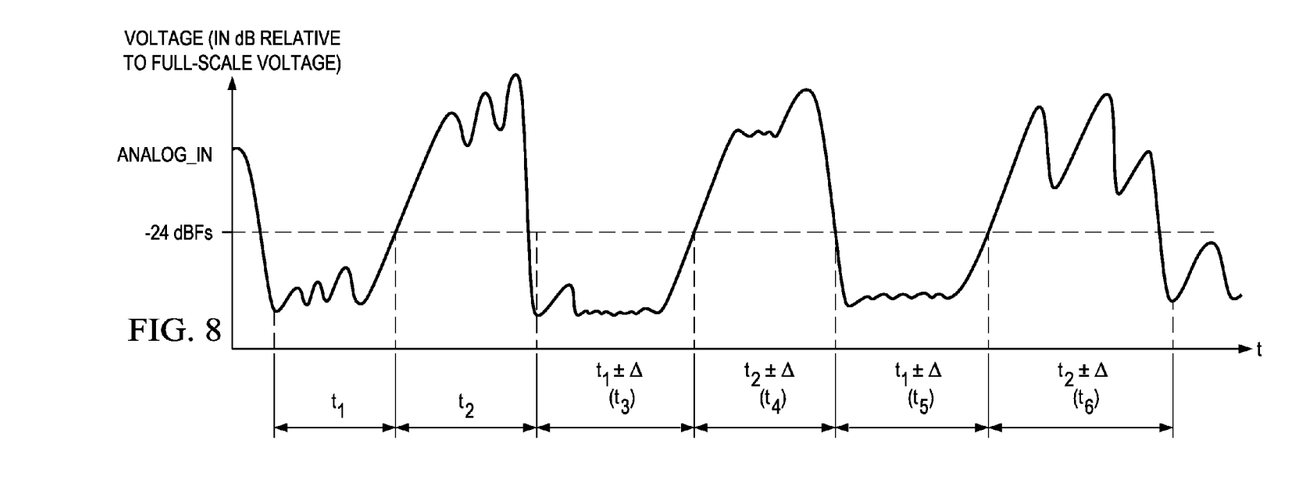

In addition or alternatively to the embodiments discussed above, controller 220 may be configured to predict when analog input signal ANALOG_IN has a persistent pattern of magnitude relative to a primary threshold, as illustrated in FIG. 8. To predict a persistent pattern, state machine 225 may record a period of time $t_1$ in which analog input signal ANALOG_IN remains below a primary threshold (e.g., −24 dB relative to full-scale voltage of digital audio input signal DIG_IN) and record a period of time $t_2$ in which analog input signal ANALOG_IN remains above the primary threshold. For one or more subsequent periods (e.g., time periods $t_3$, $t_5$) in which analog input signal ANALOG_IN is below the primary threshold, state machine 225 may determine a duration of such periods and compare them to the duration of the recorded period of time $t_1$. If the one or more subsequent periods are within a certain duration of time A of the recorded period of time $t_1$ (e.g., $t_1-\Delta \leq t_3 \leq t_1+\Delta$), controller 220 may determine that analog input signal ANALOG_IN has a persistent pattern. Similarly, for one or more subsequent periods (e.g., time periods $t_4$, $t_6$) in which analog input signal ANALOG_IN is above the primary threshold, state machine 225 may determine a duration of such periods and compare them to the duration of the recorded period of time $t_2$. If the one or more subsequent periods are within a certain duration of time $\Delta$ of the recorded period of time $t_1$ (e.g., $t_2-\Delta \leq t_4 \leq t_2+\Delta$), controller 220 may determine that analog input signal ANALOG_IN has a persistent pattern. In some embodiments, responsive to determining that a persistent pattern exists, controller 220 may disable switching between gain modes of the selectable digital gain and the selectable audio gain. In other embodiments, when a persistent pattern exists, controller 220 may use information regarding the persistent pattern (e.g., time periods $t_1$ and/or $t_2$) to predict occurrence of a future crossing of the primary threshold by digital audio input signal DIG_IN, and cause a switch between processing paths 2-1 at a zero-crossing event occurring immediately before the future crossing of the primary threshold.

In addition or alternatively to the embodiments discussed above, controller 220 may be configured to predict when analog input signal ANALOG_IN crosses a primary threshold by receiving analog input signal ANALOG_IN and processing such signal before the signal propagates to multiplexer 227, such that controller 220 may determine and apply the desired selectable digital gain and selectable audio gain at or before the signal propagates to multiplexer 227. In these and other embodiments, particularly in embodiments in which system latency is not a concern, signal buffers may be added to processing paths 201 in order that the predictive approaches discussed above may be able to undertake prediction processing before an actual switching transition is needed at multiplexer 227.

Figure 9:
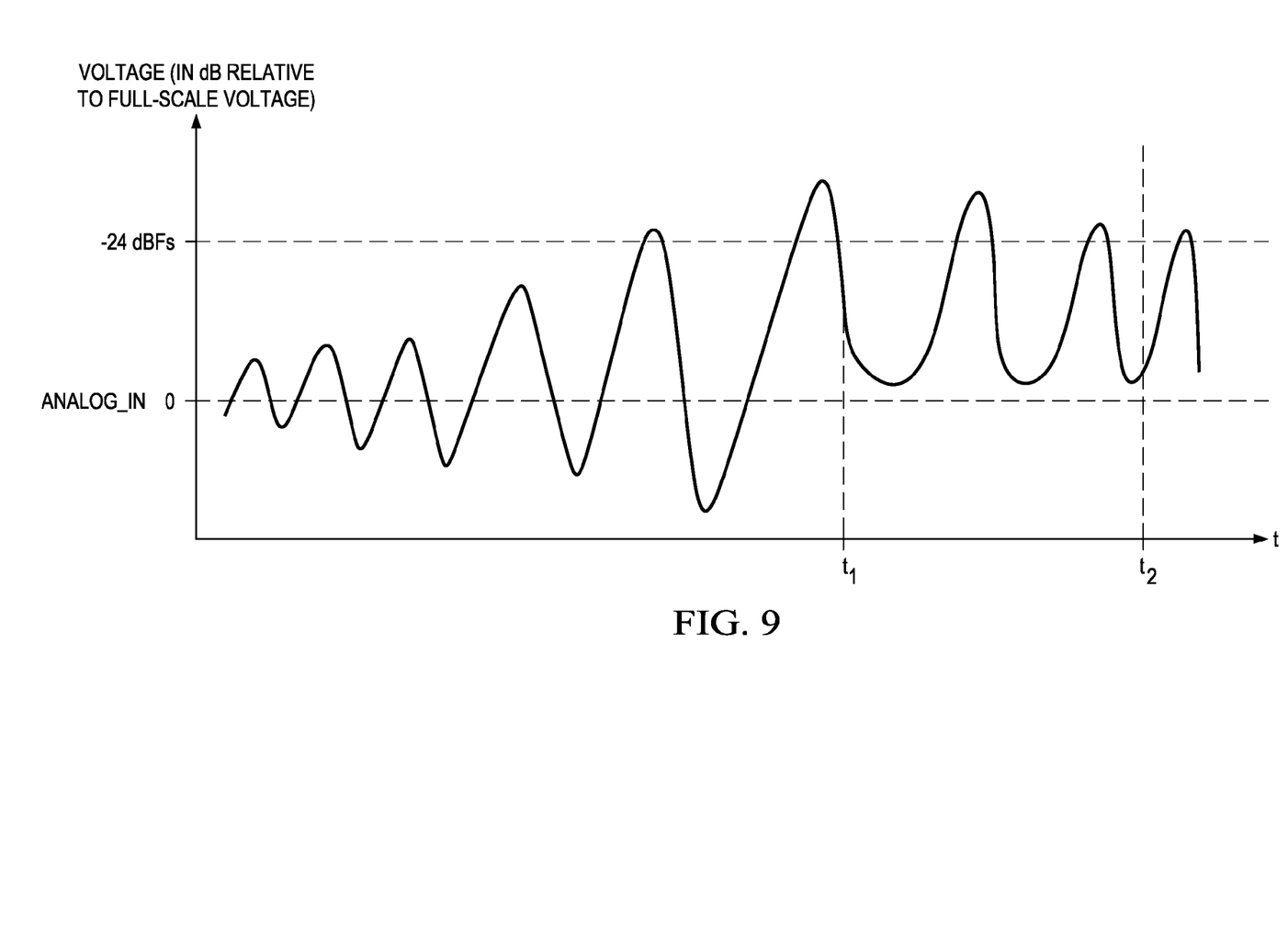

In addition or alternatively to the embodiments discussed above, controller 220 may employ one or more timing elements to trigger switching selection between the digital signal generated by processing path 201b and the digital signal generated by processing path 201a when the magnitude of analog input signal ANALOG_IN crosses from above to below a predetermined threshold, but then does not have a zero crossing within a period of time after falling below such threshold, as illustrated in FIG. 9. In the embodiments represented by FIG. 9, upon the magnitude of analog input signal ANALOG_IN crossing below a primary threshold (e.g., −24 dB relative to full-scale voltage of analog input signal ANALOG_IN), as shown at time $t_1$ in FIG. 9, state machine 225 may initiate a timing element for a predetermined duration. If analog input signal ANALOG_IN fails to experience a zero crossing prior to the predetermined duration of time expiring, as shown at time $t_2$ in FIG. 9, controller 220 may cause switching of selection between the digital signal generated by processing path 201b and the digital signal generated by processing path 201a, regardless of the fact a zero crossing has not occurred.

In some embodiments, switching selection of digital output signal DIGITAL_OUT from the digital signal of ADC 215a to the digital signal of ADC 215b (or vice versa), may occur substantially immediately. However, in some embodiments, to reduce or eliminate artifacts from occurring when switching selection of digital output signal DIGITAL_OUT from the digital signal of ADC 215a to the digital signal of ADC 215b (or vice versa), controller 220 and multiplexer 227 may be configured to blend (e.g., crossfade) continuously or in steps digital output signal DIGITAL_OUT from a first digital signal to a second digital signal such that during such transition, digital output signal DIGITAL_OUT is a weighted average of the first digital signal and the second digital signal wherein a weight of the second digital signal relative to a weight of the first digital signal increases during the transition. For example, if a transition is desired between the digital signal of ADC 215a and the digital signal of ADC 215b as digital output signal DIGITAL_OUT, such transition may be in steps, wherein in each step, controller 220 and/or multiplexer 227 weighs digital signals output by ADCs 215 as follows:

1) 100% digital signal of ADC 215a and 0% digital signal of ADC 215b;
2) 80% digital signal of ADC 215a and 20% digital signal of ADC 215b;
3) 60% digital signal of ADC 215a and 40% digital signal of ADC 215b;
4) 30% digital signal of ADC 215a and 70% digital signal of ADC 215b;
5) 10% digital signal of ADC 215a and 90% digital signal of ADC 215b; and
6) 0% digital signal of ADC 215a and 100% digital signal of ADC 215b.

As another example, if a transition is desired between digital signal of ADC 215b and digital signal of ADC 215a as digital output signal DIGITAL_OUT, such transition may be in steps, wherein in each step, controller 220 and/or multiplexer 227 weighs digital signals output by ADCs 215 as follows:

1) 100% digital signal of ADC 215b and 0% digital signal of ADC 215a;
2) 70% digital signal of ADC 215b and 30% digital signal of ADC 215a;
3) 60% digital signal of ADC 215b and 40% digital signal of ADC 215a;
4) 20% digital signal of ADC 215b and 80% digital signal of ADC 215a;
5) 5% digital signal of ADC 215b and 95% digital signal of ADC 215a; and 6) 0% digital signal of ADC 215*b* and 100% digital signal of ADC 215*a*.

In some embodiments, a transition in digital output signal DIGITAL_OUT (either continuously or in steps) from the digital signal of ADC 215*a* to the digital signal of ADC 215*b* (or vice versa) may occur over a defined maximum duration of time. In these and other embodiments, when transitioning (either continuously or in steps) digital output signal DIGITAL_OUT from the digital signal of ADC 215*b* to the digital signal of ADC 215*a*, a rate of transition may be based on a magnitude of analog input signal ANALOG_IN (e.g., the rate of transition may be faster at lower amplitudes and slower at higher amplitudes). In such embodiments, the minimum rate of such transition may be limited such that the transition occurs over a defined maximum duration of time, wherein the maximum duration of time is independent of the magnitude of the analog input signal.

In these and other embodiments, switching between steps of transition as discussed above may occur at or near a zero crossing of analog input signal ANALOG_IN, so as to further reduce the likelihood of audible audio artifacts.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A processing system comprising:
   a plurality of processing paths including a first processing path and a second processing path, wherein:
   the first processing path is configured to generate a first digital signal based on an analog input signal; and
   the second processing path is configured to generate a second digital signal based on the analog input signal; and
   wherein the first processing path has a lower gain and a higher noise floor than the second processing path;
   a controller configured to:
   determine that a transition between the first processing path and the second processing path needs to occur based on the analog input signal crossing a threshold or a prediction that the input signal will cross the threshold;
   in response to determining the transition between the first processing path and the second processing path needs to occur, blend the transition during or near zero cross points of the analog input signal.

2. The processing system of claim 1 comprising:
   a controller further configured to, transition continuously or in a plurality of steps the digital output signal between the first digital signal and the second digital signal, wherein a rate of the transition is based on the magnitude of the analog input signal, and such that during such transition, the digital output signal is a weighted average of the first digital signal and the second digital signal, wherein a weight of the second digital signal relative to a weight of the first digital signal increases or decreases during the transition.

3. The processing system of claim 1, wherein:
   the first processing path comprises a first analog front end and a first digital processing subsystem having a first analog-to-digital converter, wherein the first analog front end is configured to amplify the analog input signal in order to generate a first amplified analog signal and the first analog-to-digital converter is configured to convert the first amplified analog signal into the first digital signal; and
   the second processing path comprises a second analog front end and a second digital processing subsystem having a second analog-to-digital converter, wherein the second analog front end is configured to amplify the analog input signal to generate a second amplified analog signal and the second analog-to-digital converter is configured to convert the second amplified analog signal into the second digital signal, and further wherein a magnitude of a gain of the second analog front end is substantially larger than a magnitude of a gain of the first analog front end.

4. The processing system of claim 1, wherein the processing system is an audio processing system, and the analog input signal and the digital output signal are each an audio signal.

5. The processing system of claim 1 wherein the controller is further configured to transition continuously or in a plurality of steps the digital output signal between the first digital signal and the second digital signal, wherein a rate of the transition is based on the magnitude of the analog input signal, and such that during such transition, the digital output signal is a weighted average of the first digital signal and the second digital signal, wherein a weight of the second digital signal relative to a weight of the first digital signal increases or decreases during the transition.

6. The processing system of claim 1, wherein the controller is further configured to transition continuously or in a plurality of steps the digital output signal between the first digital signal and the second digital signal, wherein each of the plurality of steps occurs responsive to the input signal crossing the threshold or the prediction that the input signal will cross the threshold.

7. The processing system of claim 1, wherein the controller is further configured to predict the analog input signal crossing the threshold responsive to a magnitude of the analog input signal increasing above a second threshold less than the threshold.

8. The processing system of claim 1, wherein the controller is further configured to predict the analog input signal crossing the threshold responsive to a magnitude of the analog input signal decreasing below a second threshold greater than the predetermined threshold magnitude.

9. The processing system of claim 1, wherein the controller is further configured to predict the analog input signal crossing the threshold by:

tracking signal peaks of the analog input signal;
extrapolating from the signal peaks a future value of a magnitude of the analog input signal; and
predicting that the magnitude of the analog input signal will cross the threshold based on the future value.

10. The processing system of claim 1, wherein the controller is further configured to predict the analog input signal crossing the threshold by:
tracking a signal envelope of the analog input signal;
extrapolating from the envelope a future value of the magnitude of the analog input signal; and
predicting that the analog input signal will cross the threshold based on the future value.

11. The processing system of claim 1, wherein the controller is further configured to determine that the transition needs to occur responsive to a magnitude of audio input signal lacking a persistent pattern of magnitude relative to the predetermined threshold magnitude.

12. A method comprising:
generating a first digital signal with a first processing path based on an analog input signal;
generating a second digital signal with a second processing path based on the analog input signal, wherein the first processing path has a lower gain and a higher noise floor than the second processing path;
determining that a transition between the first processing path and the second processing path needs to occur based on the analog input signal crossing a threshold or a prediction that the input signal will cross the threshold;
in response to determining the transition between the first processing path and the second processing path needs to occur, blending the transition during or near zero cross points of the analog input signal.

13. The method of claim 12, further comprising transitioning continuously or in a plurality of steps the digital output signal between the first digital signal and the second digital signal, wherein a rate of the transition is based on the magnitude of the analog input signal, and such that during such transition, the digital output signal is a weighted average of the first digital signal and the second digital signal, wherein a weight of the second digital signal relative to a weight of the first digital signal increases or decreases during the transition.

14. The method of claim 12, wherein:
the first processing path comprises a first analog front end and a first digital processing subsystem having a first analog-to-digital converter, wherein the first analog front end is configured to amplify the analog input signal in order to generate a first amplified analog signal and the first analog-to-digital converter is configured to convert the first amplified analog signal into the first digital signal; and
the second processing path comprises a second analog front end and a second digital processing subsystem having a second analog-to-digital converter, wherein the second analog front end is configured to amplify the analog input signal to generate a second amplified analog signal and the second analog-to-digital converter is configured to convert the second amplified analog signal into the second digital signal, and further wherein a magnitude of a gain of the second analog front end is substantially larger than a magnitude of a gain of the first analog front end.

15. The method of claim 12, wherein the analog input signal and the digital output signal are each an audio signal.

16. The method of claim 12, further comprising transitioning continuously or in a plurality of steps the digital output signal between the first digital signal and the second digital signal, wherein a rate of the transition is based on the magnitude of the analog input signal, and such that during such transition, the digital output signal is a weighted average of the first digital signal and the second digital signal, wherein a weight of the second digital signal relative to a weight of the first digital signal increases or decreases during the transition.

17. The processing system of claim 12, further comprising transitioning continuously or in a plurality of steps the digital output signal between the first digital signal and the second digital signal, wherein each of the plurality of steps occurs responsive to the input signal crossing the threshold or the prediction that the input signal will cross the threshold.

18. The processing system of claim 12, further comprising predicting the analog input signal crossing the threshold responsive to a magnitude of the analog input signal increasing above a second threshold less than the threshold.

19. The processing system of claim 12, further comprising predicting the analog input signal crossing the threshold responsive to a magnitude of the analog input signal decreasing below a second threshold greater than the predetermined threshold magnitude.

20. The processing system of claim 12, further comprising predicting the analog input signal crossing the threshold by:
tracking signal peaks of the analog input signal;
extrapolating from the signal peaks a future value of a magnitude of the analog input signal; and
predicting that the magnitude of the analog input signal will cross the threshold based on the future value.

21. The processing system of claim 12, further comprising predicting the analog input signal crossing the threshold by:
tracking a signal envelope of the analog input signal;
extrapolating from the envelope a future value of the magnitude of the analog input signal; and
predicting that the analog input signal will cross the threshold based on the future value.

22. The processing system of claim 12, further comprising determining that the transition needs to occur responsive to a magnitude of audio input signal lacking a persistent pattern of magnitude relative to the predetermined threshold magnitude.

* * * * *

UNITED STATES PATENT AND TRADEMARK OFFICE
CERTIFICATE OF CORRECTION

PATENT NO. : 9,880,802 B2
APPLICATION NO. : 15/003371
DATED : January 30, 2018
INVENTOR(S) : Aniruddha Satoskar et al.

It is certified that error appears in the above-identified patent and that said Letters Patent is hereby corrected as shown below:

In the Claims

Column 16 Line 21 Claim 17 should read as follows:
17. The method of Claim 12, further comprising transitioning continuously or in a plurality of steps the digital output signal between the first digital signal and the second digital signal, wherein each of the plurality of steps occurs responsive to the input signal crossing the threshold or the prediction that the input signal will cross the threshold.

Column 16 Line 28 Claim 18 should read as follows:
18. The method of Claim 12, further comprising predicting the analog input signal crossing the threshold responsive to a magnitude of the analog input signal increasing above a second threshold less than the threshold.

Column 16 Line 32 Claim 19 should read as follows:
19. The method of Claim 12, further comprising predicting the analog input signal crossing the threshold responsive to a magnitude of the analog input signal decreasing below a second threshold greater than the predetermined threshold magnitude.

Column 16 Line 37 Claim 20 should read as follows:
20. The method of Claim 12, further comprising predicting the analog input signal crossing the threshold by:
    tracking signal peaks of the analog input signal;
    extrapolating from the signal peaks a future value of a magnitude of the analog input signal; and
    predicting that the magnitude of the analog input signal will cross the threshold based on the future value.

Column 16 Line 44 Claim 21 should read as follows:
21. The method of Claim 12, further comprising predicting the analog input signal crossing the threshold by:

Signed and Sealed this
Twenty-first Day of August, 2018

Andrei Iancu
*Director of the United States Patent and Trademark Office* tracking a signal envelope of the analog input signal;
extrapolating from the envelope a future value of the magnitude of the analog input signal; and predicting that the analog input signal will cross the threshold based on the future value.

Column 16 Line 51 Claim 22 should read as follows:
22. The method of Claim 12, further comprising determining that the transition needs to occur responsive to a magnitude of audio input signal lacking a persistent pattern of magnitude relative to the predetermined threshold magnitude.